(12) United States Patent
Chen et al.

(10) Patent No.: US 8,937,353 B2
(45) Date of Patent: Jan. 20, 2015

(54) DUAL EPITAXIAL PROCESS FOR A FINFET DEVICE

(75) Inventors: Hung-Kai Chen, Taichung (TW); Hsien-Hsin Lin, Hsin-Chu (TW); Chia-Pin Lin, Xinpu Township (TW); Chien-Tai Chan, Hsinchu (TW); Yuan-Ching Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 633 days.

(21) Appl. No.: 12/714,796

(22) Filed: Mar. 1, 2010

(65) Prior Publication Data

US 2011/0210393 A1    Sep. 1, 2011

(51) Int. Cl.
| | |
|---|---|
| *H01L 21/00* | (2006.01) |
| *H01L 21/8234* | (2006.01) |
| *H01L 21/8238* | (2006.01) |
| *H01L 21/84* | (2006.01) |
| *H01L 29/66* | (2006.01) |
| *H01L 29/78* | (2006.01) |

(52) U.S. Cl.
CPC ...... *H01L 21/823431* (2013.01); *H01L 21/823821* (2013.01); *H01L 21/845* (2013.01); *H01L 29/66795* (2013.01); *H01L 29/785* (2013.01)
USPC .................... 257/347; 257/E21.014; 438/142

(58) Field of Classification Search
CPC ....................................................... H01L 2/001
USPC ........................... 257/347, E21.014; 438/142
See application file for complete search history.

(56) References Cited

U.S. PATENT DOCUMENTS

| | | |
|---|---|---|
| 6,413,802 B1 | 7/2002 | Hu et al. |
| 6,706,571 B1 | 3/2004 | Yu et al. |
| 6,815,738 B2 | 11/2004 | Rim |
| 6,858,478 B2 | 2/2005 | Chau et al. |
| 6,969,659 B1 | 11/2005 | Anderson et al. |
| 7,122,412 B2 | 10/2006 | Chen et al. |
| 7,190,050 B2 | 3/2007 | King et al. |
| 7,247,887 B2 | 7/2007 | King et al. |
| 7,250,657 B2 | 7/2007 | Liaw |

(Continued)

FOREIGN PATENT DOCUMENTS

| | | |
|---|---|---|
| JP | 5218416 A | 8/1993 |
| JP | 2009054705 A | 3/2009 |

OTHER PUBLICATIONS

Official Action issued Feb. 4, 2013, in counterpart Chinese Patent Application No. 201010243829.6.

*Primary Examiner* — Matthew Gordon
(74) *Attorney, Agent, or Firm* — Duane Morris LLP; Steven E. Koffs

(57) ABSTRACT

A method includes forming a first fin and a second fin extending above a semiconductor substrate, with a shallow trench isolation (STI) region between them. A space is defined between the first and second fins above a top surface of the STI region. A first height is defined between the top surface of the STI region and top surfaces of the first and second fins. A flowable dielectric material is deposited into the space. The dielectric material has a top surface above the top surface of the STI region, so as to define a second height between the top surface of the dielectric material and the top surfaces of the first and second fins. The second height is less than the first height. First and second fin extensions are epitaxially formed above the dielectric, on the first and second fins, respectively, after the depositing step.

18 Claims, 4 Drawing Sheets

(56) References Cited

U.S. PATENT DOCUMENTS

| | | |
|---|---|---|
| 7,265,008 B2 | 9/2007 | King et al. |
| 7,355,233 B2 | 4/2008 | Liaw |
| 7,508,031 B2 | 3/2009 | Liu et al. |
| 7,528,465 B2 | 5/2009 | King et al. |
| 7,564,081 B2 | 7/2009 | Zhu et al. |
| 7,605,449 B2 | 10/2009 | Liu et al. |
| 7,790,633 B1 * | 9/2010 | Tarafdar et al. ............... 438/788 |
| 8,039,843 B2 | 10/2011 | Inaba |
| 2003/0178670 A1 | 9/2003 | Fried et al. |
| 2004/0110331 A1 | 6/2004 | Yeo et al. |
| 2004/0195624 A1 | 10/2004 | Liu et al. |
| 2004/0256647 A1 | 12/2004 | Lee et al. |
| 2005/0153490 A1 | 7/2005 | Yoon et al. |
| 2006/0084211 A1 | 4/2006 | Yang et al. |
| 2007/0034925 A1 * | 2/2007 | Lee et al. ..................... 257/296 |
| 2007/0063261 A1 | 3/2007 | Chen et al. |
| 2007/0076477 A1 | 4/2007 | Hwang et al. |
| 2007/0080387 A1 | 4/2007 | Liu et al. |
| 2007/0120154 A1 | 5/2007 | Zhu et al. |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2007/0228372 A1 | 10/2007 | Yang et al. |
| 2007/0231984 A1 * | 10/2007 | Metz et al. ..................... 438/197 |
| 2008/0006908 A1 | 1/2008 | Lin et al. |
| 2008/0169484 A1 | 7/2008 | Chuang et al. |
| 2008/0290470 A1 | 11/2008 | King et al. |
| 2008/0296632 A1 | 12/2008 | Moroz et al. |
| 2008/0296702 A1 | 12/2008 | Lee et al. |
| 2009/0181477 A1 | 7/2009 | King et al. |
| 2009/0230478 A1 | 9/2009 | Pillarisetty et al. |
| 2011/0042744 A1 * | 2/2011 | Cheng et al. ................... 257/347 |
| 2011/0049583 A1 * | 3/2011 | Lin et al. ....................... 257/288 |

* cited by examiner

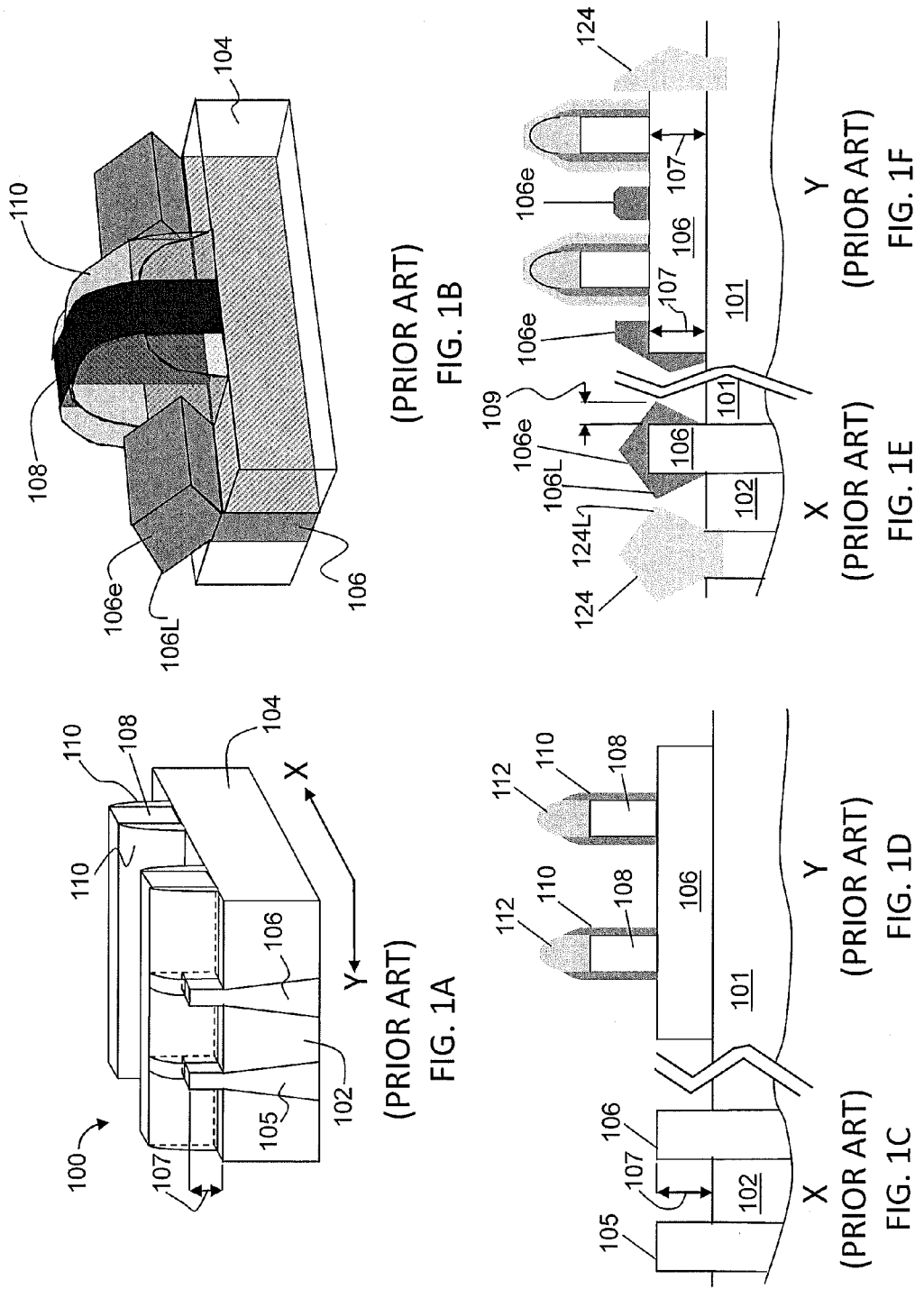

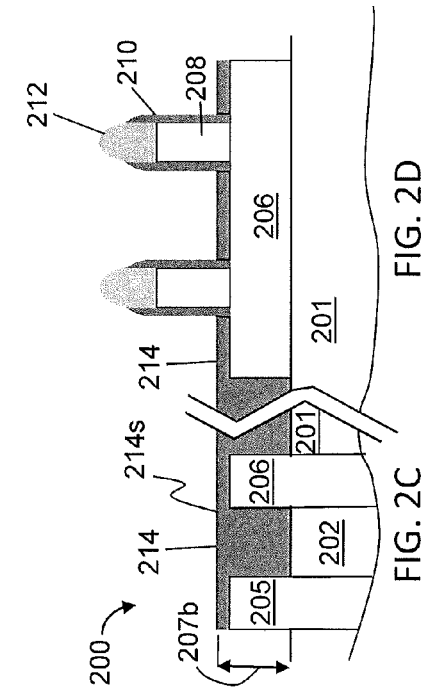
FIG. 2A
FIG. 2B
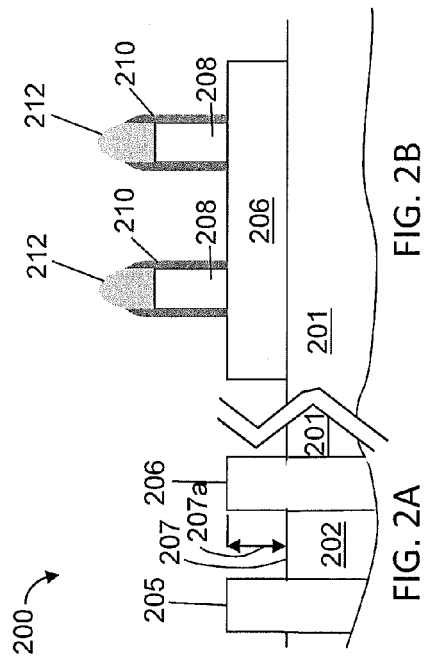
FIG. 2C
FIG. 2D
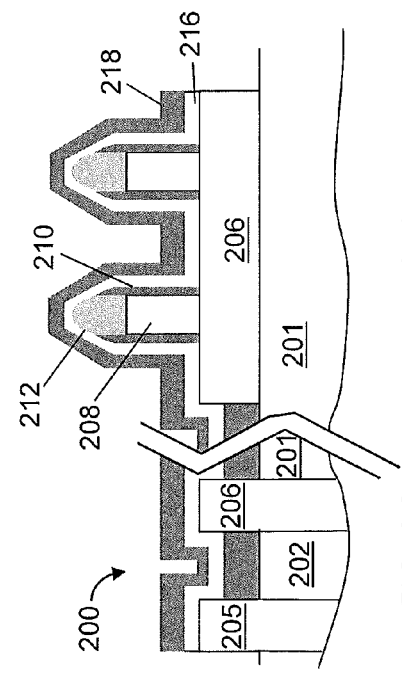
FIG. 2E
FIG. 2F
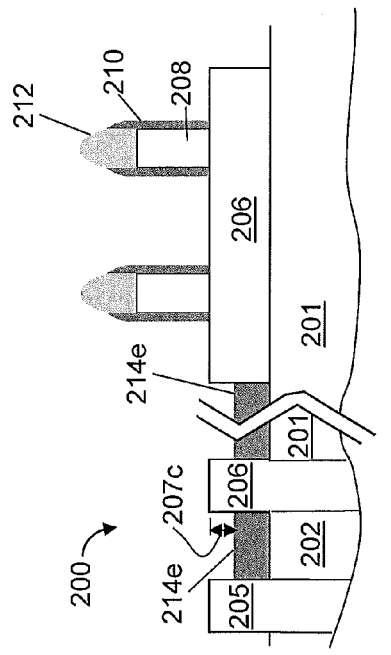
FIG. 2G
FIG. 2H

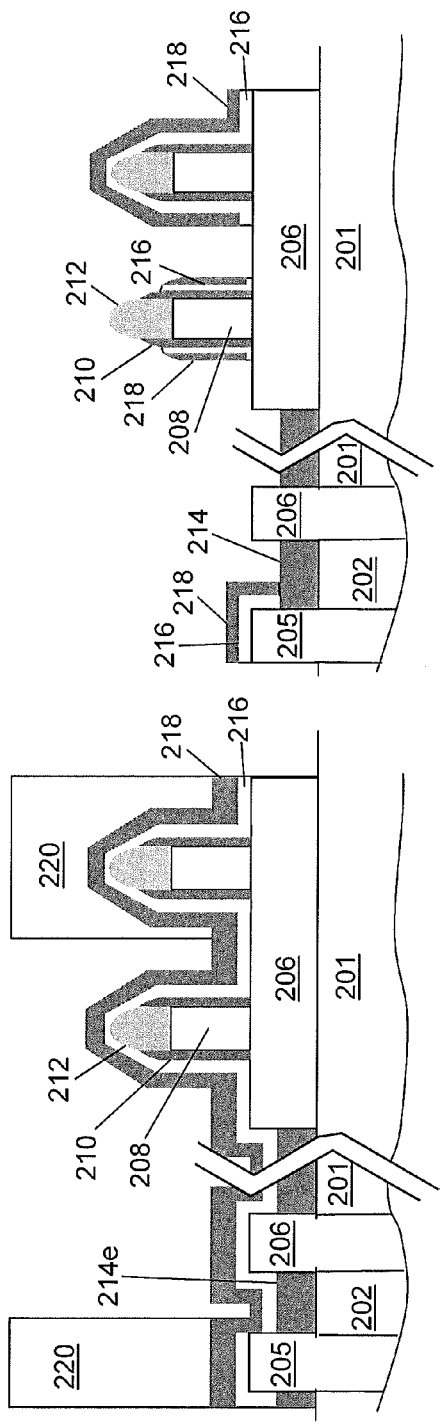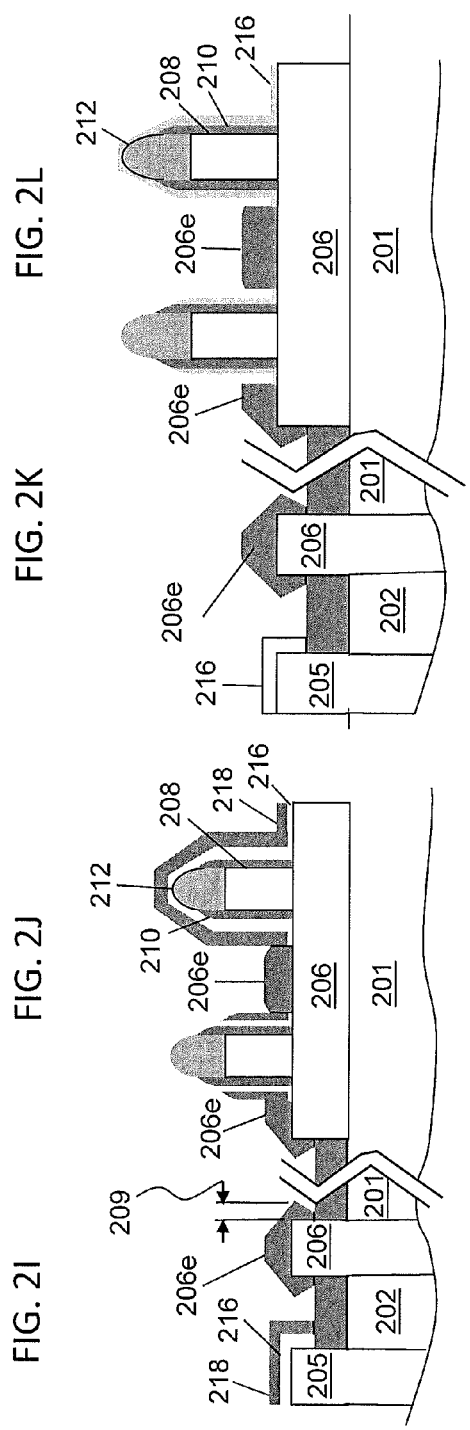

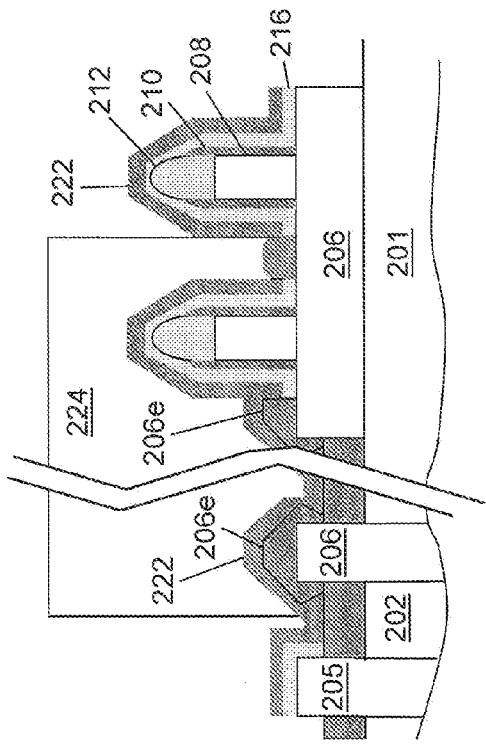
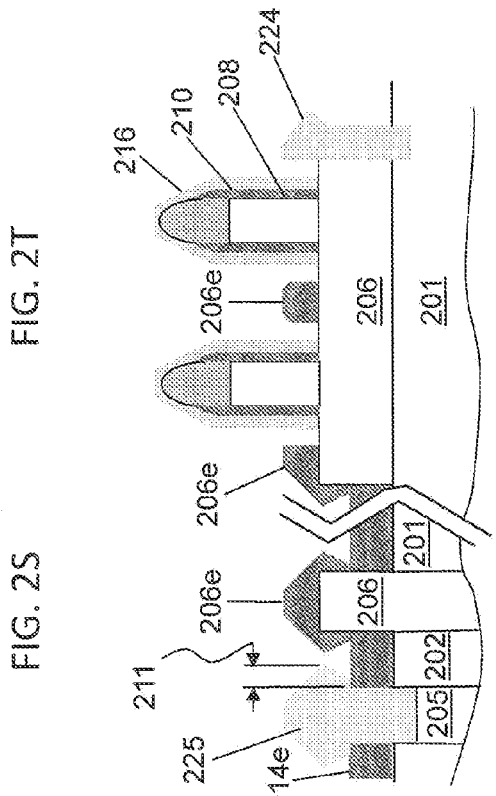
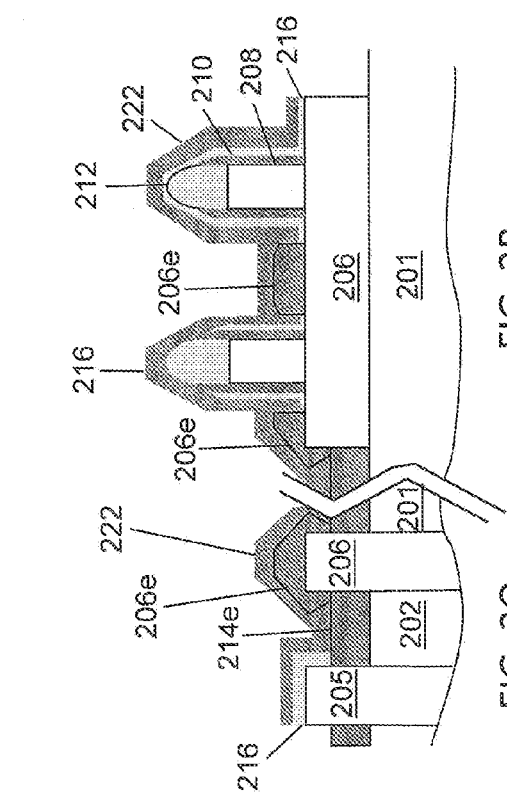
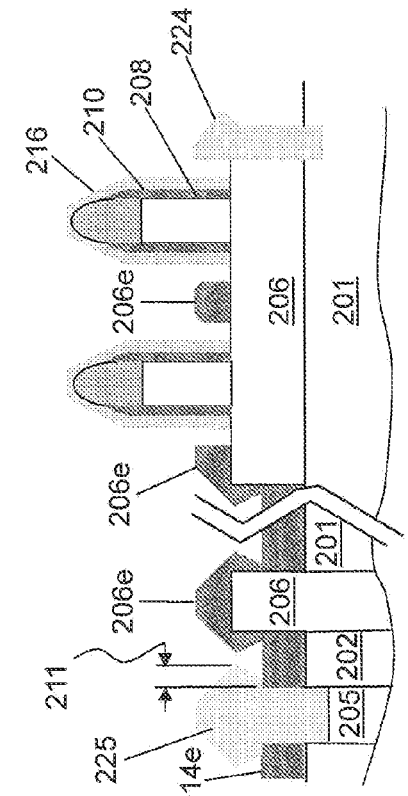
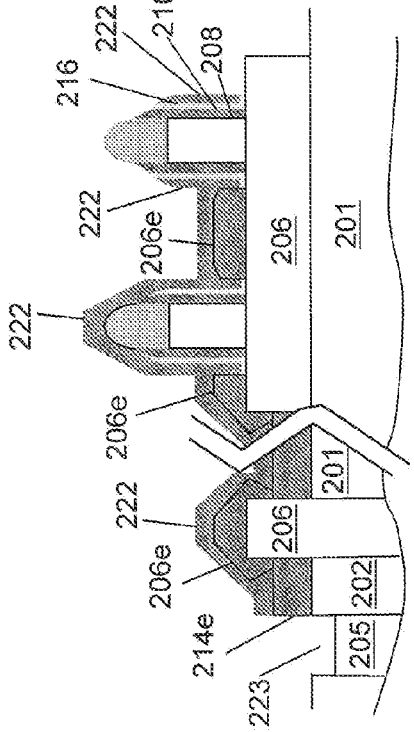

DUAL EPITAXIAL PROCESS FOR A FINFET DEVICE

FIELD OF THE INVENTION

This disclosure relates to semiconductor fabrication generally, and more specifically to fin field effect transistors (finFETs).

BACKGROUND

In the rapidly advancing semiconductor manufacturing industry, complementary metal oxide semiconductor (CMOS) finFET devices are favored for many logic and other applications and are integrated into various different types of semiconductor devices. FinFET devices typically include semiconductor fins with high aspect ratios formed vertically with respect to a top surface of the substrate, and in which channel and source/drain regions of semiconductor transistor devices are formed. The fins are isolated, raised structures. A gate is formed over and along the sides of the fins, utilizing the advantage of the increased surface area of the channel and source/drain regions to produce faster, more reliable and better-controlled semiconductor transistor devices.

FIG. 1A is an isometric view of a conventional finFET 100. The fins 105, 106 comprise raised oxide defined (OD) regions 105, 106 above a semiconductor substrate 101 (shown in FIGS. 1C, 1D). Fins 105, 106 are separated from each other by a shallow trench isolation (STI) region 102, and are located between a pair of STI regions 104. The fins 105, 106 have a step height 107 above the top surface of the STI regions 102. Polycrystalline silicon gate electrodes 108 are formed above the fins 105, 106. Sidewall spacers 110 are formed on both sides of each gate electrode 110, for forming lightly doped drain (LDD) implant regions (not shown).

FIG. 1B shows one of the fins 106 after an epitaxial growth step raises the surface 106e of the fin 106. The top portion 106e of the fin 106 acquires an approximately pentagonal shape, with lateral extensions 106L that extend in the direction of the top surface of the substrate 101 (shown in FIGS. 1C, 1D).

FIGS. 1C and 1D show the X-direction (front) and Y-direction (side) elevation views of the finFET 100 of FIG. 1A, after formation of the silicon oxide hard mask 112 and dummy side wall spacers 110, but before the epitaxial layer formation.

FIGS. 1E and 1F show the X-direction (front) and Y-direction (side) elevation views of the finFET 100 of FIG. 1A, after performing dual epitaxial processing. A photoresist (not shown) is deposited over the PMOS, and a first epitaxial process is performed on the NMOS fin 106, forming a Si, SiP, or SiC layer 106e over the fin 106 of the NMOS finFET. The PMOS is formed by a silicon recess process, in which the NMOS is masked by a photoresist (not shown), the silicon is etched from the PMOS dummy fin 105 and is replaced by SiGe, grown in the second epitaxial formation step. Thus, as shown in FIGS. 1E and 1F, the dummy fin 105 of the PMOS is replaced by a solid SiGe fin 124.

As shown in FIG. 1E, the epitaxial SiGe lateral extension 124L of PMOS fin 124 and lateral extension 106L of NMOS fin 106e extend laterally towards each other, reducing the window between adjacent fin side extensions.

SUMMARY OF THE INVENTION

In some embodiments, a method comprises forming a first fin and a second fin extending above a semiconductor substrate, with a shallow trench isolation (STI) region therebetween. A space is defined between the first and second fins above a top surface of the STI region. A first height is defined between the top surface of the STI region and top surfaces of the first and second fins. A flowable dielectric material is deposited into the space. The dielectric material has a top surface above the top surface of the STI region, so as to define a second height between the top surface of the dielectric material and the top surfaces of the first and second fins. The second height is less than the first height. First and second fin extensions are epitaxially formed above the dielectric, on the first and second fins, respectively, after the depositing step.

In some embodiments, a method comprises forming a first fin and a second fin extending above a semiconductor substrate, with a shallow trench isolation (STI) region therebetween. A space is defined between the first and second fins above a top surface of the STI region. A first height is defined between the top surface of the STI region and top surfaces of the first and second fins. The first and second fins have a first longitudinal direction. A first gate electrode is formed over the first fin. The first gate electrode has a second longitudinal direction normal to the first longitudinal direction. A flowable silicon oxide or silicon nitride dielectric material is deposited into the space. The dielectric material has a top surface above the top surface of the STI region, so as to define a second height between the top surface of the dielectric material and the top surfaces of the first and second fins. The second height is less than the first height. First and second fin extensions are epitaxially formed above the dielectric, on the first and second fins, respectively, after the depositing step.

In some embodiments, a finFET comprises a first fin and a second fin extending above a semiconductor substrate, with a shallow trench isolation (STI) region therebetween. A space is defined between the first and second fins above a top surface of the STI region. The fins having a first longitudinal direction. A first gate electrode is over the first fin. The first gate electrode has a second longitudinal direction normal to the first longitudinal direction. A flowable dielectric material layer is provided on the top surface of the STI region, so as to define a step height between the top surface of the dielectric material and the top surfaces of the first and second fins that is smaller than a distance between the top surface of the STI region and the top surfaces of the first and second fins. First and second epitaxial SiGe lateral fin extensions are provided above the dielectric, on the first and second fins, respectively. The fin extensions extend laterally beyond side edges of the fin below a top surface of the dielectric material.

BRIEF DESCRIPTION OF THE DRAWINGS

FIG. 1A is an isometric view of a conventional finFET.
FIG. 1B shows one of the fins of the device of FIG. 1A, after epitaxial growth step.
FIGS. 1C to 1F show the finFET before and after epitaxial SiGe formation on the fins.
FIGS. 2A to 2X show various stages in the fabrication of a finFET according to an embodiment of the disclosure.

DETAILED DESCRIPTION

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The inventors have discovered that, for advanced technology nodes (e.g., 22 nm or smaller), the epitaxial SiGe formation on the fins of a finFET narrows the window between the lateral extensions of adjacent fins of the NMOS and PMOS transistors so severely that bridging may occur. Even without complete bridging, the narrowing of the window between the adjacent fin extensions may cause voids in the first inter metal dielectric (IMD) layer, which is deposited after completion of the active device processing. Such voids can occur in the space beneath and between the adjacent PMOS and NMOS fin extensions.

FIGS. 2A to 2X show an example of a method and structure for reducing the lateral extension of the epitaxially formed SiGe. A flowable dielectric material is deposited over the shallow trench isolation (STI) regions by a low pressure chemical vapor deposition (LPCVD) process, to reduce the step height between the top of the STI and the top of the fin OD. By reducing this step height, a target amount of SiGe can be formed on the fin with a reduced lateral fin extension. Thus, the narrowing of the window between adjacent fin lateral extensions is reduced or avoided.

In each pair of adjacent FIGS. 2A and 2B, 2C and 2D, 2E and 2F, 2G and 2H, 2I and 2J, 2K and 2L, 2M and 2N, 2O and 2P, 2Q and 2R, 2S and 2T, 2U and 2V, 2W and 2X), the left figure is a front (X direction) view with the longitudinal direction of the fins 205, 206 extending into the page. The corresponding right figure is a side (Y direction) view with the longitudinal direction of the fin extending from left to right in the plane of the drawing.

FIGS. 2A and 2B show the device 200 including NMOS and PMOS structures after the fins 205, 206, polycrystalline silicon gate conductor 208, side spacers 210 and hard mask 212 are defined, and the LDD implant has been performed. The device 200 includes a first fin 205 and a second fin 206 extending in a first longitudinal direction above a semiconductor substrate 201, with a shallow trench isolation (STI) region 202 therebetween, and a space 207 defined between the first and second fins 205, 206 above a top surface of the STI region, and a first height 207a between the top surface of the STI region 202 and top surfaces of the first and second fins 205, 206. Gate electrodes 208 are formed over the first and second fins 205, 206. The gate electrodes 208 have a second longitudinal direction normal to the first longitudinal direction. A thin gate dielectric layer (not shown) is formed between the fins 205, 206 and the gate electrodes 208.

Semiconductor substrate 201 may be bulk silicon, bulk silicon germanium (SiGe), or other Group III-V compound substrate. The substrate includes STI regions 202 between the fins 205, 206.

STI formation typically includes recess formation on the Si substrate and forming an oxide film using CVD process, such as a low pressure CVD (LPCVD) or plasma enhanced CVD (PECVD), then using chemical mechanical polishing (CMP) to remove extra STI oxide film. The STI regions may be filled with TEOS, SiO, SiN or the like. In one embodiment, the STI dielectric is deposited by an LPCVD process at a temperature of over 500° C. At the conclusion of the STI formation, there is a step height 207a (first height) between the top of the STI region 202 and the top of the fins 205, 206.

FIGS. 2C and 2D show deposition of a non-topography sensitive flowable dielectric film 214 by an LPCVD process. The film has a height above the top of the STI dielectric 202, and at least partially fills the space 207. In some embodiments, the film 214 is initially deposited to have a planar surface 214s above the top of the fin OD 205, 206. The film 214 may be silicon oxide (SiOx) or silicon nitride (SINx), for example. Because of differences in the lattice size of silicon and SiNx, use of the nitride material may result in formation of compressive stressor regions, which may be desired for enhancing carrier migration and improving PMOS drain saturation current Idsat, without substantial degradation in NMOS Idsat. Similarly, in other embodiments, use of SiOx for the flowable dielectric may result in a tensile stressor region for improving NMOS characteristics.

The flowable CVD process may be performed at a temperature of about 20° C. and a pressure of about 100 kPa. After deposition, an ozone $O_3$ curing step is performed at a temperature of about 200° C. and a pressure of about 600 Torr for about 10 minutes. A O2 plasma treatment step is performed at a temperature of about 400° C. for about 20 seconds to densify the flowable CVD film quality. After the O2 plasma treatment, the etching rate using 100:1 diluted HF can be reduced by about 80%. The surface 214s of the deposited film 214 has a height 207b that is higher than the top surfaces of the fins 205, 206 by about 10 nm.

FIGS. 2E and 2F show the structure 200 after an etch back step for etching back the top of the flowable CVD film 214 below the top surfaces of the fins 205, 206. This step may be performed using a chemical wet etch, such as dilute hydrogen fluoride (DHF), a plasma dry etch or a chemical dry etch method to partially remove the CVD film 214. The resulting etched back film 214e is shown in FIGS. 2E and 2F. The etch back process removes the top portion of the CVD film 214 above the top surfaces of fins 205, 206, to prepare the fins for the SiGe recess source drain process, and may etch back the film further to a level below the top surfaces of the fins 205, 206.

The etching back step defines a second height 207c between the top surface of the dielectric material and the top surfaces of the first and second fins 205, 206, such that the second height 207c is less than the first height 207a. The second height 207c is less than the first height 207a by a sufficient amount to prevent merger of the first and second fin extensions during the subsequent epitaxy steps. In some embodiments, a ratio of the second height to the first height is about 0.67% or less. In some embodiments, a ratio of the second height to the first height is about 50%.

In one example, for fins 205, 206 having a width of 20 nm, the initial step height 207a is 30 nm, and the second height 207c is 20 nm. Thus, the ratio of the second height 207c to the first height 207a is 67%. In another example, for fins 205, 206 having a width of 20 nm, the initial step height 207a is 40 nm, and the second height 207c is 20 nm. Thus, the ratio of the second height 207c to the first height 207a is 50%.

FIGS. 2G and 2H show the dummy sidewall (DSW) deposition which allows subsequent selective epitaxial growth. First a conformal oxide (SiOx) layer 216 is formed over the entire device. Then a conformal nitride (SiN) layer 218 is formed over the oxide layer 216. An LDD anneal step is also performed.

As shown in FIGS. 2I and 2J, a photoresist 220 is deposited over the substrate, and a photolithographic process is performed to selectively remove the photoresist 220 over the NMOS, while keeping the photoresist over the PMOS.

Next, an anisotropic etch (e.g., a dry etch) is performed to remove the oxide layer 216 and nitride layer 218 except for the dummy sidewall spacers formed adjacent the NMOS gate electrode 208. Then the photoresist 220 is removed (for example, by ashing), as shown in FIGS. 2K and 2L.

FIGS. 2M and 2N show the first part of the dual epitaxial process. The epitaxial Si, SiP, or SiC layer 206e is grown over the exposed top and side edges of the fin 206 of the NMOS. Because of the reduced step height (second height) 207c (FIG. 2E) between the top of the flowable CVD 214e and the top of the fin 206, the epitaxial growth of fin 206 results in a lateral extension distance 209 (FIG. 2M) that is less than the lateral extension 109 (FIG. 1E). In some embodiments, the epitaxial growth raises the top of Si, SiP, or SiC layer 206e about 20 nm above the top of the NMOS silicon fin 206. Although the 20 nm height of this layer 206e is the same as the corresponding height of the layer 106e shown in FIG. 1E, the lateral extensions on the layer 206e are smaller, because of the reduced step height 207c relative to the step height 107 of FIG. 1E.

In FIGS. 2O and 2P, the nitride layer 218 is selectively etched away by isotropic etching (e.g., a wet etch).

In FIGS. 2Q and 2R, another conformal nitride layer 222 is formed over the entire device 200.

Next, a photoresist 224 is deposited and a photolithographic process is performed to remove the photoresist over the PMOS, while leaving the photoresist 224 over the NMOS, as shown in FIGS. 2S and 2T.

Next, anisotropic etching (e.g., a dry etch) is performed to etch away the top portion of the PMOS fin 205, forming a recess 223 in the top portion of the PMOS fin 205. This etching step also removes the nitride 222 over the gate of the PMOS. Following the etch, the photoresist 224 is removed (e.g., by ashing), as shown in FIGS. 2U and 2V.

Next, the second epitaxial growth step is performed, growing the SiGe 225 at the top of PMOS fin 205. Similarly to the case of the NMOS described above, the PMOS lateral extensions extend beyond the side edge of the PMOS fin 205 by an extension length 211 that is smaller than the length of the PMOS fin extension 124L. In some embodiments, the epitaxial growth raises the top of SiGe structure 225, about 20 nm above the top of the PMOS silicon fin 205 shown in FIG. 2T. The nitride hard mask 222 is removed by a selective etch, as shown in FIGS. 2W and 2X.

The source/drain implants are then performed transistors.

Table 1 shows a comparison between the lateral extensions under different conditions. All 5 row correspond to fin widths of 20 nm. All five rows also correspond to a final SiGe top surface that is 20 nm higher than the initial top surface of the fins before the epitaxial processes. The nominal space is about 50 nm between the fins 205, 206 before the epitaxial process.

In Table 1, Row 3 corresponds to nominal conditions for the configuration of FIGS. 1E and 1F, with a step height of 30 nm between the top surface of the STI region and the top of the fins 106e, 124. The lateral extension due to the SiGe growth is 24.7 nm on each side of the fins. Row 5 corresponds to the worst case condition (with a step height of 40). The lateral extensions are 28.2 nm on each side of the fin. This condition could cause merger of adjacent fins, or a void beneath the SiGe lateral extensions, because of a decrease in the window between the fin extensions. Row 1 corresponds to FIGS. 2W, 2X, where the step height between the top surface of the flowable dielectric layer 214e and the top of the fins 205, 206 is only 20 nm. The lateral extension is reduced to 21.2 nm, preventing merger between adjacent fins, and leaving sufficient window between the fins so that the etch stop layer (not shown) and IMD (not shown) subsequently deposited over the finFET are able to enter and fill the space between the fin extensions, avoiding formation of a void in the IMD.

TABLE 1

| | Comment | STEP HEIGHT | SiGe raise | Lateral Extension |
|---|---|---|---|---|
| 1 | FIGS. 2W, 2X | 20.0 | 20.0 | 21.2 |
| 2 | | 25.0 | 20.0 | 23.0 |
| 3 | FIGS. 1E, 1F, nominal | 30.0 | 20.0 | 24.7 |
| 4 | | 35.0 | 20.0 | 26.5 |
| 5 | FIGS. 1E, 1F worst case | 40.0 | 20.0 | 28.2 |

In the embodiment shown in FIGS. 2A to 2X, the SiGe recess process is only performed on the PMOS (the PMOS SiGe recess source drain, or PSSD step). The PSSD step forms a recess in place of the top of the fin 205, to gain larger SiGe volume, as shown in FIGS. 2W and 2X, and PSSD etch will stop on the original Si surface.

In other embodiments (not shown) an NMOS Si, SiP, or SiC recess source drain (NSSD) step is performed on the NMOS fin 206, also forming a recess in place of the top of the NMOS fins. In embodiments having the NSSD step, a larger Si, SiP, or SiC volume is performed on the NMOS.

In other embodiments (not shown), a single epitaxial growth step is used, and the PMOS fin is processed in the same manner as the NMOS fin, without using the Si recess.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method comprising:
    forming a first fin and a second fin extending above a semiconductor substrate, with a shallow trench isolation (STI) region therebetween, and a given space of about 50 nm defined between the first and second fins above a top surface of the STI region, a given first height between the top surface of the STI region and top surfaces of the first and second fins;
    providing a flowable dielectric material in the space, the dielectric material having a top surface above the top surface of the STI region, so as to define a second height from 20 nm to 25 nm between the top surface of the dielectric material and the top surfaces of the first and second fins; and
    epitaxially forming first and second fin extensions above the dielectric, on the first and second fins, respectively, after the providing step, so as to achieve a given final height of the fin extensions about 20 nm above the first height of the first and second fins, without merger of the first and second fin extensions during the epitaxial forming step.

2. The method of claim 1, wherein the first height is from 30 nm to 40 nm.

3. The method of claim 2, wherein:
    the providing step includes:
        flowing a sufficient amount of the dielectric over the substrate, so that the top surface of the dielectric is above the top surface of the first and second fins; and etching back the dielectric, so that a top surface of the etched dielectric is below a top surface of the first and second fins;

the epitaxially forming step includes forming a recess in a top of one of the first and second fins, and growing SiGe on a top surface of at least one of the first and second fins to fill the recess.

4. The method of claim 1, wherein the dielectric providing step includes a low pressure chemical vapor deposition (LPCVD) process.

5. The method of claim 4, wherein the LPCVD process is performed at a temperature of about 20° C. and a pressure of about 100 kPa.

6. The method of claim 5, further comprising after providing the dielectric, performing an ozone curing step at a temperature of about 200° C. and a pressure of about 600 Torr for about 10 minutes, and performing an $O_2$ plasma treatment step at a temperature of about 400° C. for about 20 seconds.

7. The method of claim 1, wherein a ratio of the second height to the first height is about 0.67% or less.

8. The method of claim 7, wherein a ratio of the second height to the first height is about 50%.

9. The method of claim 1, wherein the providing step includes:

flowing a planar layer of the dielectric over the substrate to completely fill the space; and etching back the dielectric, so that a top surface of the etched dielectric is below a top surface of the first and second fins.

10. The method of claim 9, wherein flowing the planar layer includes applying a sufficient amount of the dielectric, so that the top surface of the dielectric is above the top surface of the first and second fins before the etching back.

11. The method of claim 1, wherein the first and second fins have a first longitudinal direction, the method further comprises forming a first gate electrode over the first fin, the first gate electrode having a second longitudinal direction normal to the first longitudinal direction, the first fin includes a source and a drain of an NMOS transistor, the second fin includes a source and a drain of a PMOS transistor, and the epitaxial forming step includes first and second epitaxial forming steps for the NMOS and PMOS transistors, respectively.

12. The method of claim 1, wherein the dielectric material is silicon oxide.

13. The method of claim 1, wherein the dielectric material is silicon nitride.

14. The method of claim 1, wherein the epitaxially forming step includes growing SiGe on a top surface of at least one of the first and second fins.

15. The method of claim 1, further comprising forming a recess in a top of one of the first and second fins, wherein the epitaxially forming step includes growing SiGe to fill the recess.

16. The method of claim 1, wherein the first and second fins have a first longitudinal direction the method further comprising:

forming a first gate electrode over the first fin, the first gate electrode having a second longitudinal direction normal to the first longitudinal direction.

17. The method of claim 16, wherein the dielectric providing step includes a low pressure chemical vapor deposition (LPCVD) process performed at a temperature of about 20° C. and a pressure of about 100 kPa.

18. The method of claim 17, further comprising, after the dielectric providing step, performing an ozone curing step at a temperature of about 200° C. and a pressure of about 600 Torr for about 10 minutes, and performing an $O_2$ plasma treatment step at a temperature of about 400° C. for about 20 seconds.

* * * * *